US010563429B1

(12) United States Patent
Bailey et al.

(10) Patent No.: US 10,563,429 B1
(45) Date of Patent: Feb. 18, 2020

(54) RACK COMPONENT LATCHES (71) Applicant: Amazon Technologies, Inc., Seattle, WA (US)

(72) Inventors: Kevin Bailey, Seattle, WA (US); Christopher Strickland Beall, Woodinville, WA (US); Brandyn David Giroux, Seattle, WA (US); Michael Jon Moen, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/918,688

(22) Filed: Mar. 12, 2018

(51) Int. Cl.
E05B 57/00 (2006.01)
E05B 15/08 (2006.01)
E05B 19/00 (2006.01)
H05K 7/14 (2006.01)
E05B 65/46 (2017.01)

(52) U.S. Cl.
CPC .............. *E05B 57/00* (2013.01); *E05B 15/08* (2013.01); *E05B 19/0017* (2013.01); *E05B 19/0047* (2013.01); *E05B 65/46* (2013.01); *H05K 7/1401* (2013.01); *H05K 7/1489* (2013.01)

(58) Field of Classification Search
CPC ...... E05B 57/00; E05B 19/0047; E05B 65/46; E05B 19/0017; E05B 15/08; H05K 7/1401; H05K 7/1489
See application file for complete search history.

(56) References Cited

U.S. PATENT DOCUMENTS

| 5,332,306 | A | * | 7/1994 | Babb | H05K 7/1405 312/223.1 |
| 5,632,542 | A | * | 5/1997 | Krivec | A47B 88/427 312/334.7 |
| 5,961,193 | A | * | 10/1999 | Hobbs | A47B 88/493 312/333 |
| 6,373,695 | B1 | * | 4/2002 | Cheng | G06F 1/184 312/223.1 |
| 6,464,085 | B1 | * | 10/2002 | Chin | G11B 33/128 211/26 |
| 6,550,876 | B2 | * | 4/2003 | Lammens | E05B 65/464 312/217 |
| 6,654,240 | B1 | * | 11/2003 | Tseng | G06F 1/184 312/332.1 |
| 7,318,531 | B2 | * | 1/2008 | Wu | G11B 33/128 211/26 |
| 7,364,244 | B2 | * | 4/2008 | Sandoval | H05K 7/1411 312/333 |
| 7,661,778 | B2 | * | 2/2010 | Yang | H05K 7/1489 312/333 |
| 2006/0249643 | A1 | * | 11/2006 | Weng | E05B 65/463 248/424 |

* cited by examiner

Primary Examiner — Ko H Chan
(74) Attorney, Agent, or Firm — Kilpatrick Townsend & Stockton LLP (57) ABSTRACT

Latching components for retaining rack component cases within server racks are described. In one example, a latching component is installed at an interior surface of a rack component case. The latching component includes a protrusion. The latching component is biased in a locked position in which the protrusion is outside the rack component case. The latching component is moveable from the locked position to an unlocked in which the protrusion is removed from outside the rack component case using an unlatching component.

20 Claims, 6 Drawing Sheets

RACK COMPONENT LATCHES

BACKGROUND

Rack components such as computer servers, network equipment, and other data center hardware can be stored in racks. Cases that hold these rack components may be supported in the racks on shelves and secured to the racks or shelves using combinations of screws or bolts.

BRIEF DESCRIPTION OF THE DRAWINGS

Various examples in accordance with the present disclosure will be described with reference to the drawings, in which.

DETAILED DESCRIPTION

In the following description, various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the example being described.

Examples described herein are directed to latching components for retaining rack component cases in server racks in a secure manner and in a way that increases front area of the rack component cases for interfaces (e.g., input/output interfaces). The latching components are biased to a locking position. Moving the latching components from the locking position to an unlocked position is achieved using a specialized key component. The key components are external to the rack component cases and can be distributed to a predefined group of users. This contributes to secure retention of the rack component cases. The latching components are installed on the inside walls of the rack component cases, with interfaces of the latching components being accessible through openings in the sides of the cases. The key components are inserted through openings at the front side and into the interfaces in order to unlock the latching components. As compared to conventional rack mounting devices that utilize screws and face plates, the configuration and mounting of the latching components described herein frees up space on the front sides of the cases for placement of input/output interfaces (e.g., ports, cards, etc.).

Most conventional rack mounting devices attach to server racks via support structures that terminate at forward most vertical posts of the server racks. This typically means that the forward-most surface of the rack component case (e.g., the front face) may not extend beyond the forward-most vertical posts (or else the rack component case would not be supported). Because of the latching component design including its slim profile and retractable latches, the latching components described herein allow for use of support structures such as "L" brackets that extend forward beyond the most-forward vertical posts. Because the L brackets extend beyond the most-forward vertical posts, larger (e.g., deeper) rack component cases can be used. This results in increased rack density and overall reduction in datacenter footprints.

The latching components described herein may be implemented to physically retain any suitable rack-mounted component (e.g., hardware servers for computing or storage, networking hardware for switching or load balancing, power equipment, and any other suitable device that may be used within a datacenter and mounted within a rack) to a server rack. The latching components are connected to interior surfaces of rack component cases. At least some of the embodiments described herein are capable of retaining tips of the latching components within a rack component case during installation of the rack component case into a server rack. This corresponds to an unlocked position of the latching component. Configuring the latching components in this manner creates a clean, obstruction free side surface of the case. In particular, with the latching components within the rack component case, a projection of the rack component case keeps all components within the case. For example, a projection extending from a leading side of the case excludes obstructions at the side walls (e.g., presents smooth exterior side walls), This reduces the possibility of the latches interfering with communication cables or other parts supported by the server rack or adjacent server racks. Once the rack component case has been completely installed in the server rack (e.g., pushed in all the way), the latching components are released and because of biasing are moved into the locked position. In this position, the tips extend through openings in the side walls of the rack component case and into (and in some examples through) corresponding openings in the server rack (e.g., in the L brackets). During removal of the rack component case from the server rack, the tips of the latching components can also be held in the unlocked position within the rack component case and thereby create obstruction-free exterior surfaces along side walls of the case.

Turning now to a particular example, a server case can include two latching components connected to an interior surface of the case (e.g., one on each front corner of the case). Each latching component includes an elongate flexible member, with a first end of the elongate flexible member being connected to a side wall of the interior surface adjacent to the respective front corner. The elongate flexible member includes a protruding tip that extends away from a first side of the member (e.g., toward the side wall) and a receiver structure that extends away from a second side of the member (e.g., away from the side wall). The elongate flexible member is formed from spring steel. The member is biased into a locked position such that the protruding tip extends through an opening in the side wall and into a corresponding opening in a server rack. The receiver structure is sized and configured to receive a specialized key. To unlock the latching member (e.g., to move the protruding tip back into the case), a distal tip of the key is installed through an opening in a front wall of the server case and into the receiver structure. The receiver structure includes a triangular opening and the key includes an inclined plane sized to fit within the triangular structure. A linear force is applied to the key as the key is installed into the receiver structure. This force causes a ramp portion of the inclined plane to engage with a hypotenuse leg of the triangular structure and thereby cause the flexible member to deflect. Because the flexible member is connected to the server case at one end, the opposite end that includes the protruding tip experiences rotational movement that causes the latching component to move into an unlocked position. So long as the key remains engaged with the receiver structure, the latching component will remain in the locked position.

Latching components described herein may be implemented relative to a server rack, a network hardware rack, or a tape library rack. To avoid having to repeat varied terms throughout the description, as used herein in the specification and claims, any use of "rack" (even if modified specifically by "server," "network hardware," "compute component," or "tape library" etc.) may include any of a server rack, a network hardware rack, a compute component rack, a tape library rack, a power equipment rack, or a rack that includes any combination of these options.

Figure 1:
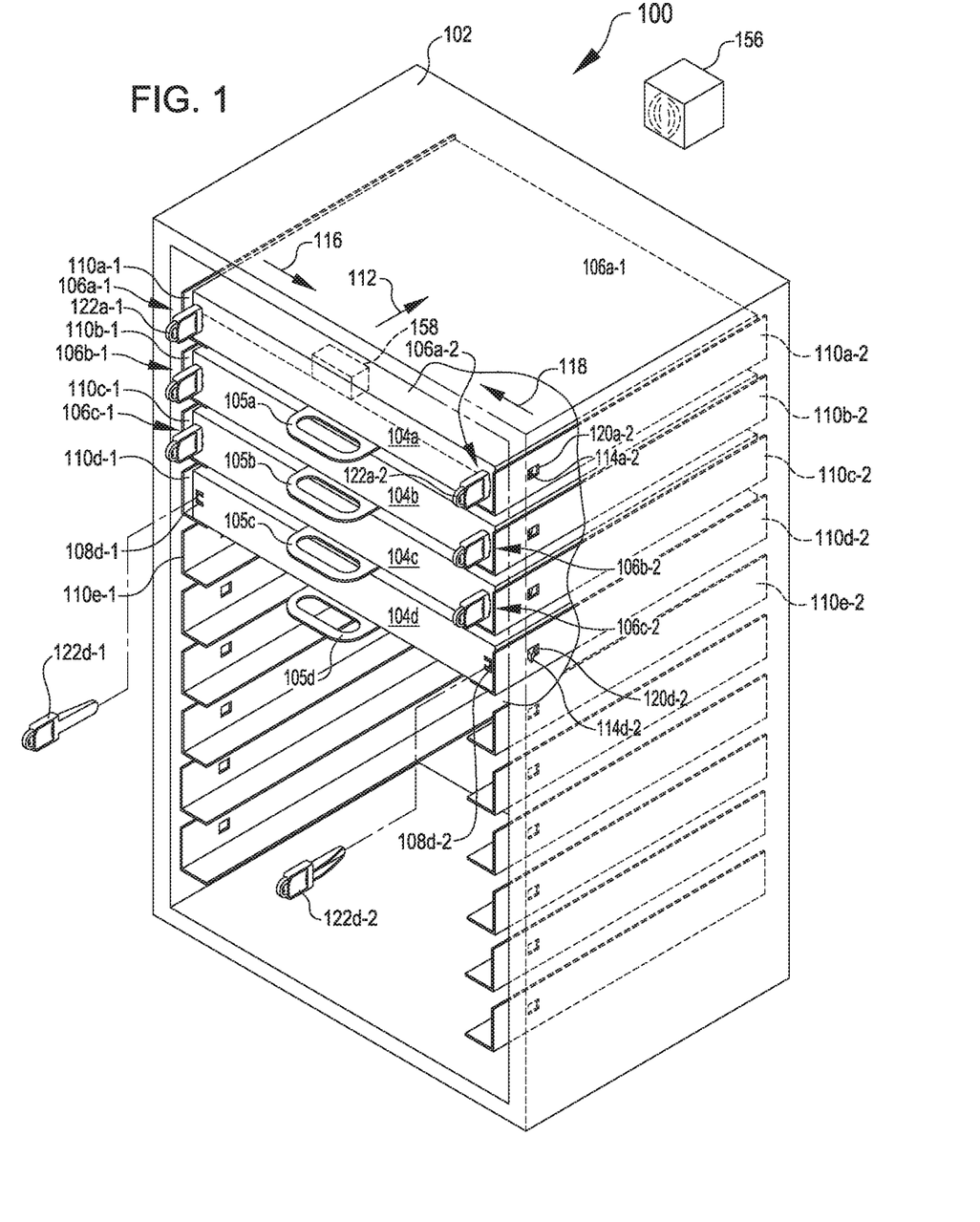
FIG. 1 illustrates a perspective view of a rack component case retaining system including rack component cases, according to at least one example.

Turning now to the figures, FIG. 1 illustrates a server retaining system 100 including a server rack 102 that supports various rack component cases 104 (a few of which illustrated in an installed state, i.e., 104a, 104b, 104c, and 104d). The rack component cases 104 may include top sides, bottom sides, two opposing sides, front sides, and rear sides. In some examples, the rack component cases 104 may be formed from a rigid material such as metal and may be configured to receive and support different rack components (e.g., networking hardware, server hardware, etc.). At their rear sides, the rack component cases 104 may include power supply interfaces for connecting to a rack power supply associated with the server rack 102. At their front sides, the rack component cases 104 may include interfaces, ports, and the like for outputting and inputting data. The approaches for retaining the rack component cases 104 in the server rack 102 conserve area for such interfaces and ports as compared to conventional approaches. This may be because the rack component cases 104 are secured to the server rack 102 using at least one latching component 106 that is disposed substantially within a rack component case 104 and includes a key opening 108 at the front side of the rack component case 104. The key opening 108 may be relatively small so as to conserve area on the front side of the rack component case 104.

The server rack 102 includes a plurality of support brackets 110, a few of which are labeled, that support the rack component cases 104. The support brackets 110, which may have any suitable shape or form (e.g., "L" bracket, "U" bracket, rail, or any other suitable form of bracket), may be connected to the server rack 102 using any suitable technique (e.g., bolted, welded, snapped, etc.). When the support brackets 110 are L brackets, a pair of such brackets may be suitable for supporting a single rack component case 104, as illustrated in FIG. 1.

The support brackets 110 are sized and configured to receive the rack component cases 104 in a sliding configuration. For example, loading or unloading of the rack component case 104a may include orienting the rack component case 104a such that a bottom surface of the rack component case 104a slides along a top surface (or a pair of top surfaces) of the support brackets 110a-1 and 110a-2 in the direction of arrow 112 for loading and in an opposite direction of the arrow 112 for unloading. In this configuration, back sides of the rack component cases 104 are the leading sides during installation and the trailing sides during removal.

Each rack component case 104 includes one or more (e.g., a pair of) latching components 106. The latching components 106 are mounted at front corners of the rack component cases 104 (e.g., at side walls within the rack component cases 104). In some examples, the latching components 106 are mounted on other sides of the rack component cases 104 (e.g., bottom side or top side). Generally speaking, the latching components 106 can be configured into one of two positions, unlocked and locked.

As illustrated in the cut-away view of the server rack 102, the latching components 106a-1 and 106a-2 are illustrated in the unlocked position. In this position, latch members 114a-1 and 114a-2 of the latching components 106a-1 and 106a-2 have been slide in the direction of arrows 116 and 118 through latch member openings 120a-1 and 120a-2 of the support brackets 110a-1 and 110a-2. This is achieved by inserting key components 122a-1 and 122a-2 into the latching components 106a-1 and 106a-2 via key openings 108 in the rack component case 104a. As described herein, the action of inserting the key components 122 causes the latch members 114 to deflect away from the vertical side walls of the support brackets 110. In this position, the rack component case 104a may be freely removed from the server rack 102 because the latch members 114a-1 and 114a-2 are retracted into the rack component case 104a.

As illustrated in the cut-away view of the server rack 102, when the key components 122d-1 and 122d-2 are removed from the key openings 108d-1 and 108d-2, the latch members 114d-1 and 114d-2 extend through the latch member openings 120d-1 and 120d-2. This corresponds to the locked position of the latching components 106. In the locked position, the latching components 106 retain the rack component cases 104 suitably to meet shock and vibration design constraints for fully loaded rack component cases 104 (e.g., loaded with compute elements). For example, the latching components 106 may be capable of retaining a 50 pound compute component in the server rack 102 in the event of a large scale earthquake, where the G force on the compute component may be very high. Because the key component 122 is needed to unlock the latching component 106, the latching component 106 may reduce crimes of opportunity, as compared to conventional connection means.

The profile of the latching components 106 has been minimized to maximize available surface area on the front face of the rack component cases 104 for placement of interfaces, ports, and the like. Use of the latching components 106 may enable rack component cases 104 that are larger (e.g., deeper) than if traditional retaining methods were employed. Since the latching components 106 are connected at the front corners of the rack component cases 104, the support brackets 110, which are connected to vertical posts inside the server rack 102, can extend forward beyond the vertical posts—and further than in conventional server racks—to the front of the rack component cases 104.

Each rack component case 104 may also include one or more handles 105. In some examples, the handles 105 are formed as part of the rack component case 104 and/or may be formed separately and connected to the rack component case 104. In some examples, the handles 105 may be offset left to right with respect to one another. In some examples, two handles 105 are connected to each rack component case 104. In this example, the two handles 105 may be offset left to right with respect to one another. For example, a first handle 105 may be attached to a top side of the rack component case 104 adjacent to a right side of the rack component case 104 and a second handle 105 may be attached to a bottom side of the rack component case 104 adjacent to a left side of the rack component case 104.

Figure 2:
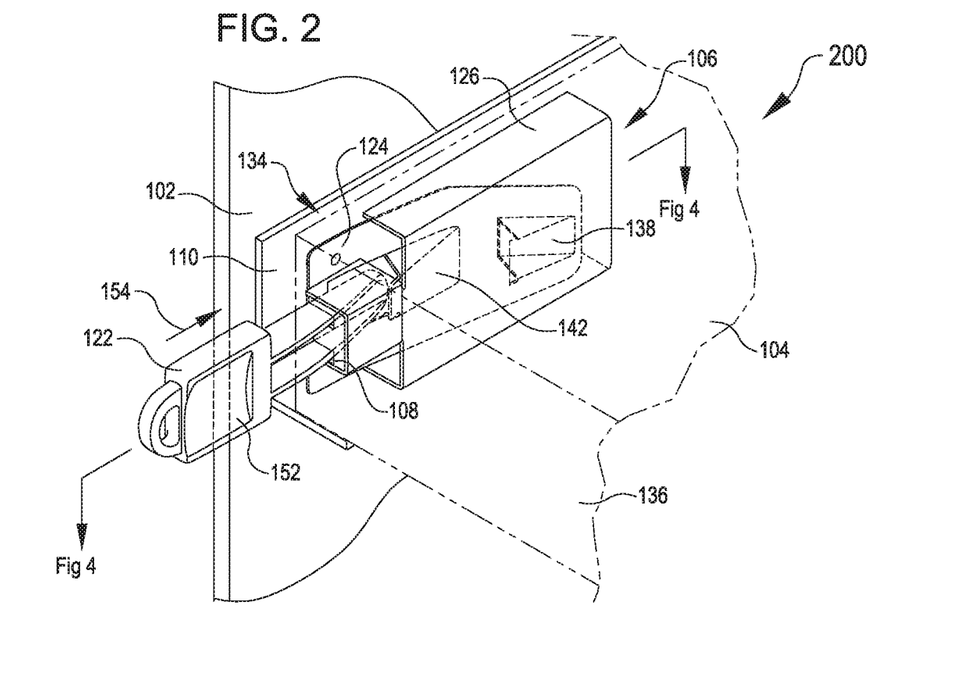
FIG. 2 illustrates a perspective view of a system including a latching component, according to at least one example.
Figure 3:
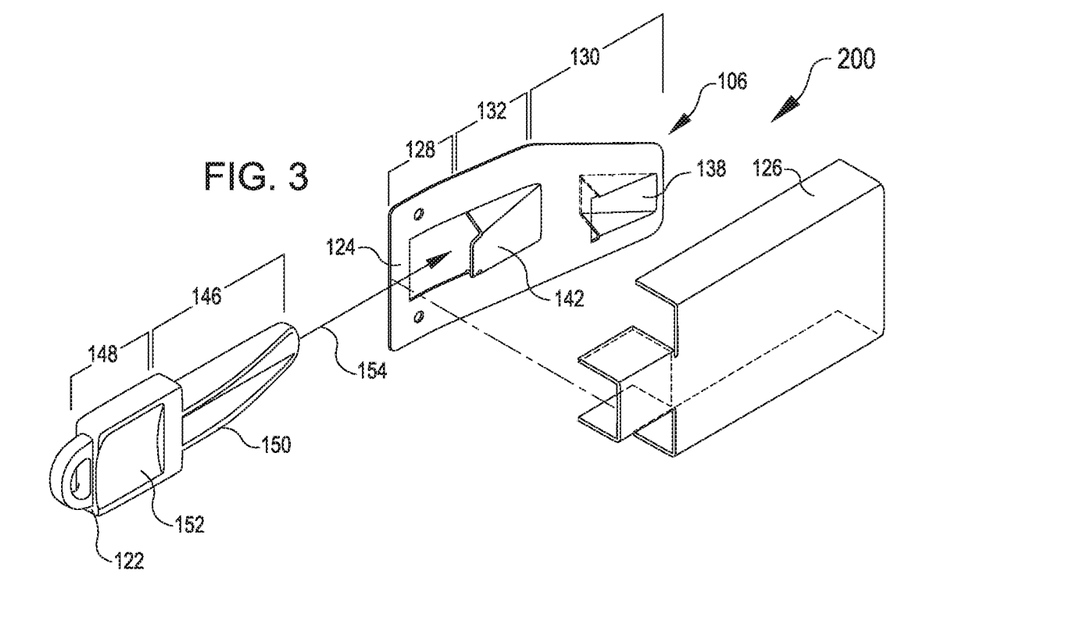
FIG. 3 illustrates a perspective view of a system including the latching component of FIG. 2, according to at least one example.

FIGS. 2-5 illustrate a system 200 including the latching component 106 from various perspectives. For example, FIGS. 2 and 3 illustrate perspective views of the system 200, according to various examples. The system 200 includes the latching component 106 and the key component 122. The latch component 106 includes a flexible member 124 and a cover plate 126.

Figure 4:
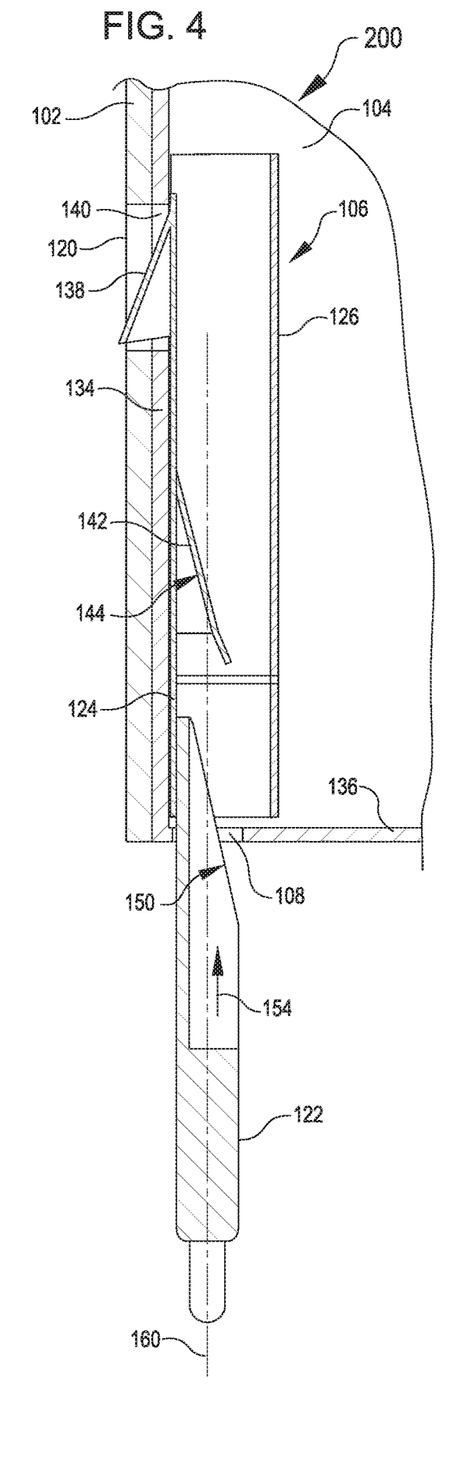
FIG. 4 illustrates a section view of a system including the latching component of FIG. 2 in a first position, according to at least one example.
Figure 5:
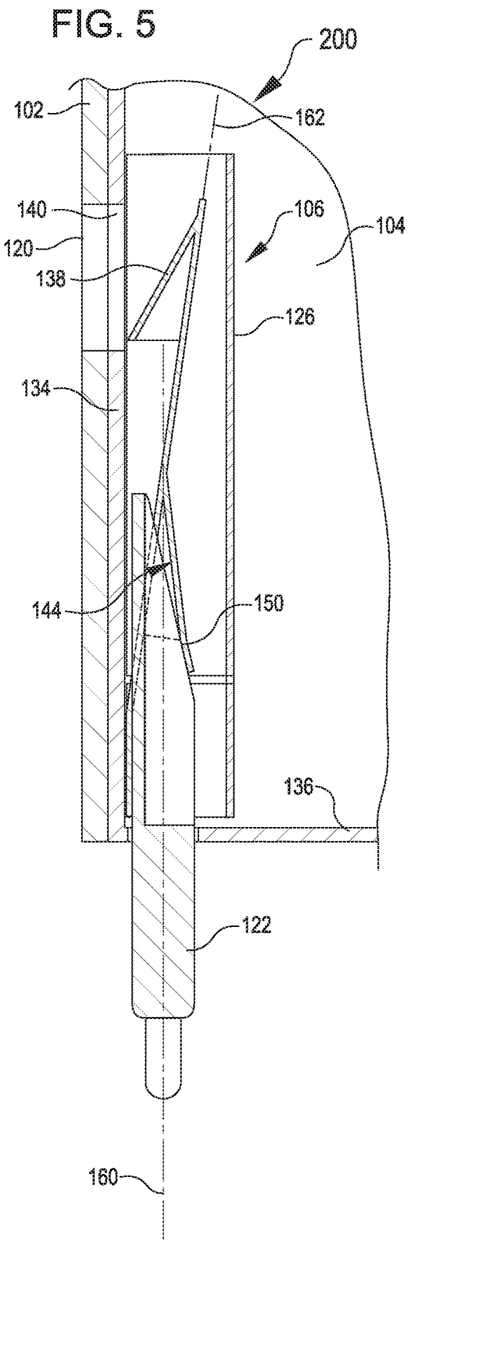
FIG. 5 illustrates a section view of a system including the latching component of FIG. 2 in a second position, according to at least one example.

The flexible member 124 can be formed from spring steel or other deflectable material such as plastic. The flexible member 124 includes a proximal portion 128, a distal portion 130, and a middle portion 132 partitioned with respect to an longitudinal dimension of the flexible member 124. The illustrations of the portions 128-132 are illustrative in nature. In any event, at the proximal portion 128, the flexible member 124 is connected to an interior surface of a side wall 134 of the rack component case 104. For example, the flexible member 124 may be riveted, screwed, spot welded, glued, or otherwise connected to the side wall 134. In some examples, the connection location is adjacent to a front wall 136 of the rack component case 104. In some examples, the flexible member 124 may be connected to the rack component case 104 at a different location, for example, on a top side or on the bottom side. The distal portion 130 is moveable with respect to the connection location at the proximal portion 128. For example, FIGS. 4 and 5 illustrate section views of the system 200, with the flexible member 124 respectively in a locked position and an unlocked position, according to various examples.

The distal portion 130 includes a latch member 138 protruding in a first direction opposite a first planar side of the flexible member 124. For example, when the latching component 106 is installed in the rack component case 104, the latch member 138 protrudes towards the side wall 134. As illustrated in FIG. 4, in the locked position, the latch member 138 extends through a pair of latch member openings, i.e., a latch member opening 140 in the side wall 134 of the rack component case 104 and a latch member opening 120 in the support brackets 110. As illustrated in FIG. 5, in the unlocked position, the latch member 138 is removed from at least the latch member opening 120 and, in some examples, is also removed from the latch member opening 140.

In the locked position, the latch member 138 interferes with surfaces in the latch member opening 120 to keep the rack component case 104 from being removed. This essentially locks the rack component case 104 into the server rack 102.

Returning to the flexible member 124, the middle portion 132 includes a receiver structure 142. In some examples, the receiver structure 142 can be disposed in the distal portion 146. The receiver structure 142 is sized and configured to receive the key component 122. In particular, the receiver structure 142 can include a triangular ramped structure, including a receiving surface 144. The triangular shape can extend from a second planar side of the flexible member 124 in a direction opposite the direction in which the latch member 138 extends. A triangular section of the receiver structure 142 can correspond to a right triangle, with a first leg aligned with the longitudinal dimension of the flexible member 124, a second leg extending in a transverse direction from the first leg at a proximal location on the flexible member 124, and a hypotenuse beginning at a distal location on the flexible member and extending proximally and angularly toward the second leg. The angle between the hypotenuse and the first leg can have any suitable value. The receiving surface 144 is aligned with the hypotenuse.

The key component 122 is sized and configured to be inserted into the receiver structure 142. The key component 122 includes a distal portion 146 and a proximal portion 148. In the distal portion 146 is defined an inclined plane 150 that corresponds in size and shape to the receiver structure 142. In some examples, the angle of the inclined plane 150 matches the angle of the receiver structure 142. In other examples, the two angles are different. The distal portion 146 is sized to fit through the key opening 108 in the front wall 136.

A process for using the key component 122 to unlock the latching component 106 will now be described. In FIG. 4, the latching component 106 is illustrated in the locked position, with the latch member 138 being within the openings 120 and 140. The latching component 106 and the key component 122 are aligned with a first axis 160. Also in FIG. 4, a distal tip of the distal portion 146 of the key component 122 has been inserted through the key opening 108 in the direction of arrow 154. For example, a human user may grasp the key component 122, align the key component 122 with the key opening 108, and insert the distal tip into the key opening 108. As the user applies additional installation force in the linear direction of the arrow 154, the key component 122 will slide toward the receiver structure 142. As this sliding continues, the inclined plane 150 of the key component 122 will contact the receiving surface 144 of the receiver structure 142. Because of the shape of the inclined plane 150 and the receiving surface 144, as this sliding contact continues, the distal portion 130 of the latching component 106 will begin to deflect about the connection location located in the proximal portion 128 of the flexible member 128. This continues until the latching component 106 has been moved to the unlocked position illustrated in FIG. 5. In the unlocked position, the distal portion 130 of the latching component 106 is aligned with a second axis 162 that is rotated about the connection location with respect to the first axis 160. Because the action of the key component 122 to unlock the latching component 106 is linear, in the unlocked position, the latching component 106 remains aligned with the first axis 160. So long as the key component 122 remains in the receiver structure 142, the latching component 106 will remain in the unlocked position. When the key component 122 is removed from the receiver structure 142, the latching component 106 returns to its biased position, the locked position.

In some examples, the latching component 106 may include a retention mechanism for retaining the latching component 106 in the unlocked position, even after the key component 122 has been removed from the latching component 106. This may be desirable to ensure that the latching members 138 are retracted within the rack component case 104 during installation and removal of the rack component case 104. Once the rack component case 104 has been installed, a triggering mechanism of the retention mechanism may be triggered to cause the retention mechanism to release the latching component 106. For example, the triggering mechanism may include a tab that extends through an opening in the bottom of the rack component case 104 or in the side wall 134. The tab can be connected to a spring-loaded mechanism of the retention mechanism that holds the latching component 106 in the unlocked position. Contact between the tab and the support brackets 110 may compress the spring-loaded mechanism and thereby release the latching component 106 back to its biased position, the locked position.

The proximal portion 148 of the key component 122 includes a structure for holding the key component 122 and an identifying device 152. The identifying device 152 may be used to identify information about the key component 122. For example, different types of key components 122 may be associated with different types of latching components 106, and the identifying device 152 may be used to record the association. In some examples, the identifying device 152 may identify a user with whom the key component 122 is associated. Examples of the identifying device 152 include a radio-frequency identification (RFID) tag, a near field communication (NFC) chip, a microcircuit, a machine- and/or human-readable code (e.g., an optical code), and any other suitable device usable to identify the key component 122.

For example, when the identifying device 152 includes an RFID tag, the system 100 may also include a reader system 156 such as an RFID reader system mounted so as to read the server rack 102. The RFID tag may be an active tag or a passive tag. In either case, the RFID reader system may be configured read the RFID tag when the tag is within a reading range of an antenna of the RFID reader system. In some examples, the RFID reader system may be capable of identifying that the RFID tag was located at a particular server rack, at a particular rack component case, and/or at a particular side of a rack component case. In some examples, the RFID reader system may also read other MD tags present within its reading range and use information about the other RFID tags to make certain determinations. For example, a user's identification badge may include an MD tag. When the user uses the key component 122 including an RFID tag, the RFID reader system or other computing device may identify the user, identify the key component 122, and determine that the user used the key component 122 to unlock a particular rack component case. Based on this information, the RFID reader system or other computing device can record the unlock event, determine whether the user is authorized to unlock the particular rack component case, generate alarms or other messages if the access is unauthorized, and perform other actions relating to the access. Other examples of the reader system 156 include NFC readers, optical scanners, and the like. In some examples, output from the reader system 156 is compared to other data to determine information about events occurring at the server rack 102. For example, output from the reader system 156 may indicate that a particular key component checked out by a particular user is present at the server rack 102. Other data may also be generated (e.g., by an position sensor, a power control unit, etc.) that indicates that a particular server was powered down, removed from the server rack, and/or translated. This other data can be compared with the output to match up the particular user with the particular key component and the particular server.

As an additional example, when the identifying device 152 includes a microchip, the distal portion 146 of the key component 122 may include electrical contacts that complete a circuit when installed in the latching component 106 and power a portion of the microchip. In some examples, the system 100 may include an onboard active device 158 in the rack component case 104 that detects when this circuit is completed and performs identification, tracking, recording, alarming, and other actions based on the detection. For example, the key component 122 may include a unique identifying number that is passed to the active device when the circuit is completed. The active device may store the identifying number in association with the rack component case 104 and perform other actions, as described herein, with respect to the key component 122. In this manner, the system may function similar to an EMV smart card system, with the comparable chip and contacts being installed in the key component 122 and the active device 158 functioning as the chip reader.

Figure 6:
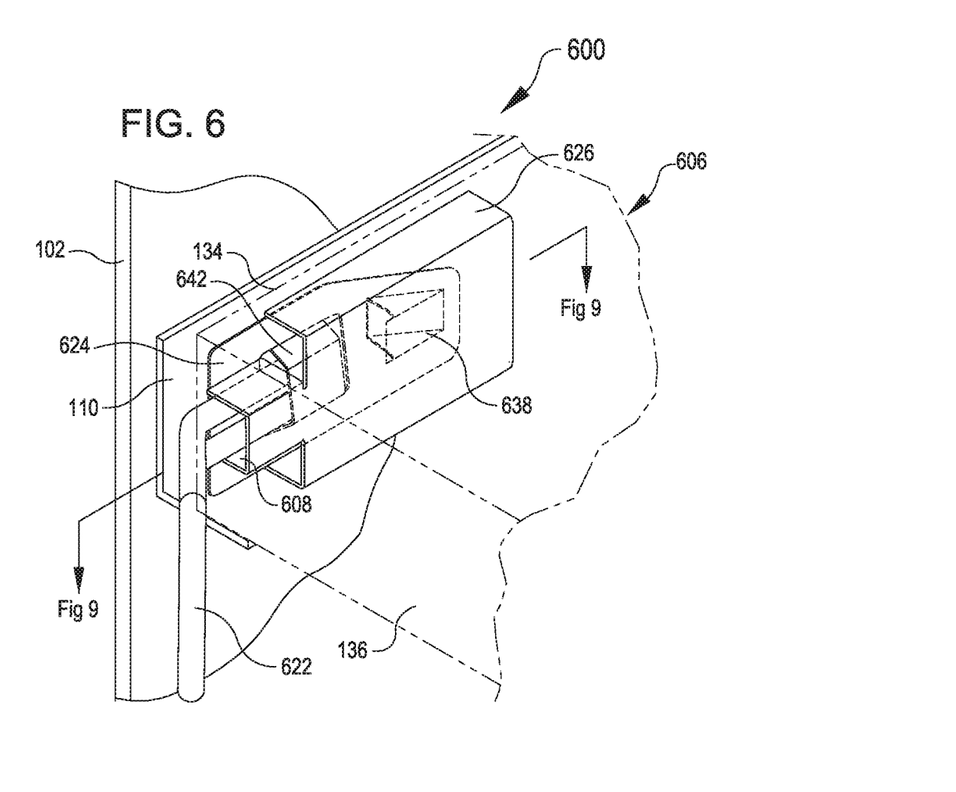
FIG. 6 illustrates a perspective view of a system including a latching component, according to at least one example.
Figure 7:
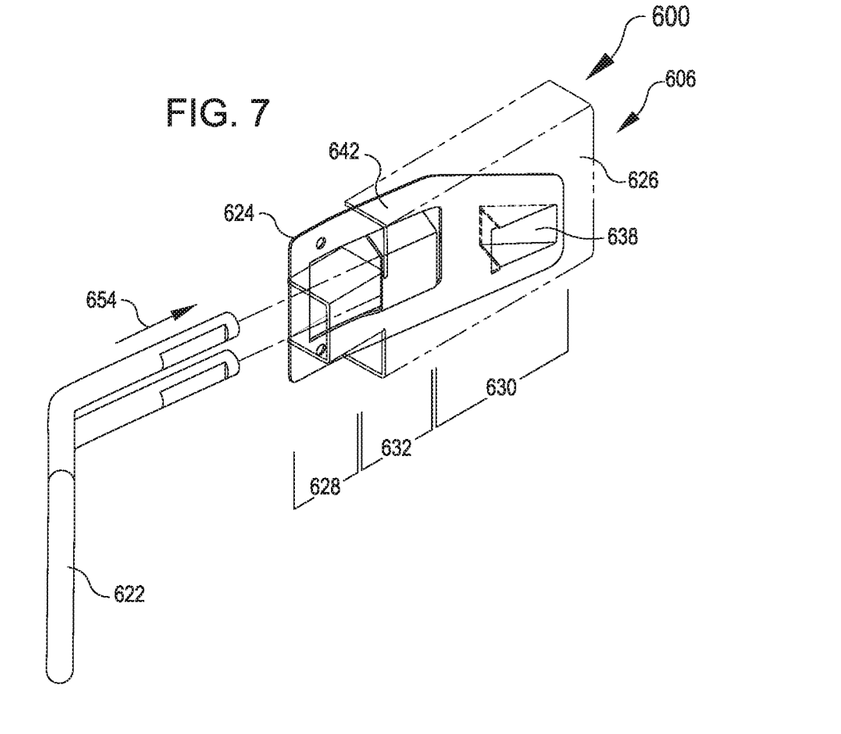
FIG. 7 illustrates a perspective view of a system including the latching component of FIG. 6, according to at least one example.

FIGS. 6, 7, 9 and 10 illustrate a system 600 including a latching component 606 from various perspectives. For example, FIGS. 6 and 7 illustrate perspective views of the system 600, according to various examples. The system 600 includes the latching component 606 and a key component 622, both of which respectively are examples of the latching component 106 and the key component 122. The latch component 606 includes a flexible member 624 and a cover plate 626.

Figure 9:
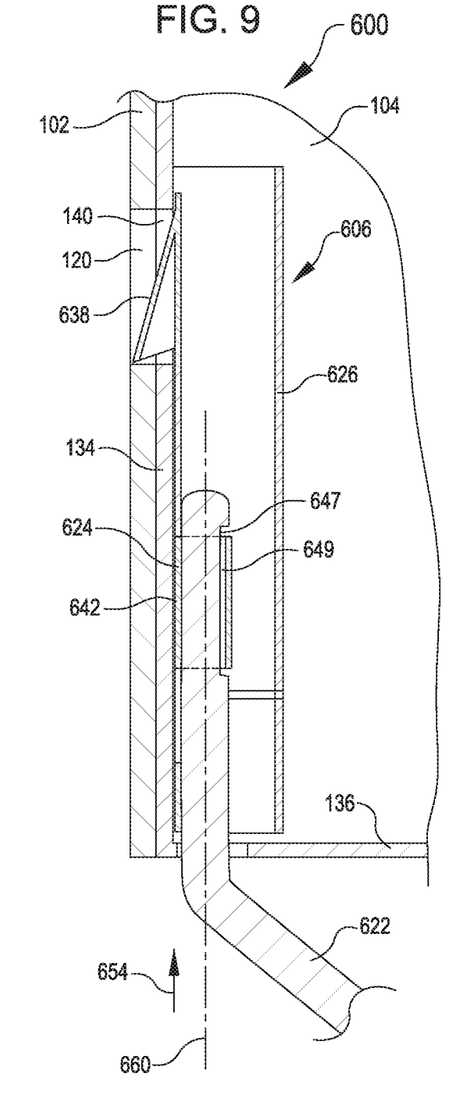
FIG. 9 illustrates a section view of a system including the latching component of FIG. 6 in a first position, according to at least one example.
Figure 10:
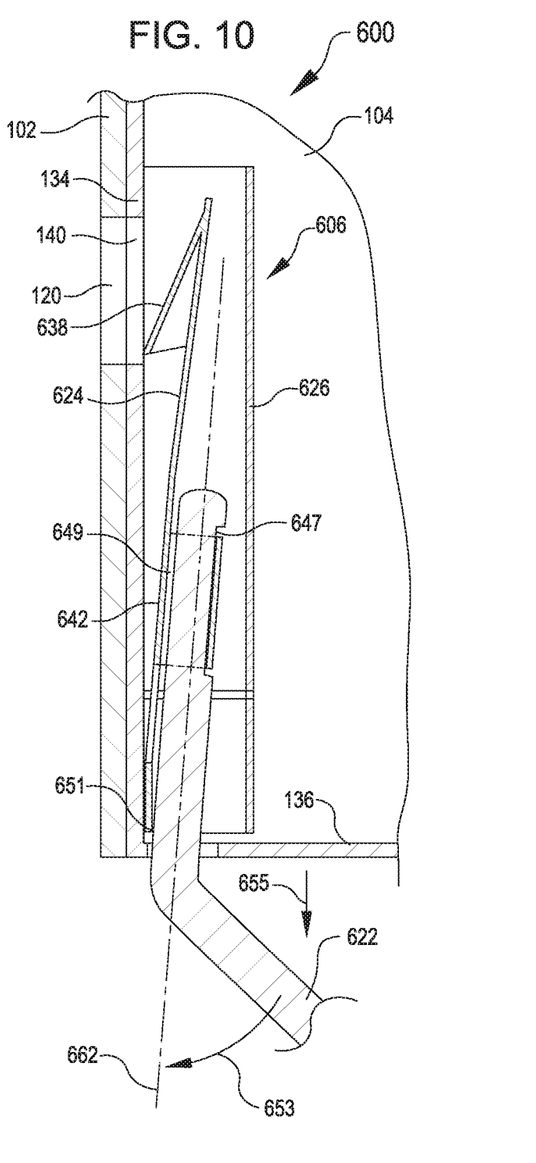
FIG. 10 illustrates a section view of a system including the latching component of FIG. 6 in a second position, according to at least one example.

The flexible member 624 can be formed from spring steel or other deflectable material such as plastic. The flexible member 624 includes a proximal portion 628, a distal portion 630, and a middle portion 632 partitioned with respect to a longitudinal dimension. The illustrations of the portions 628-632 are illustrative in nature. In any event, at the proximal portion 628, the flexible member 624 is connected to an interior surface of the side wall 134 of the rack component case 104. For example, the flexible member 624 may be riveted, screwed, spot welded, glued, or otherwise connected to the side wall 634. In some examples, the connection location is adjacent to the front wall 136. In some examples, the flexible member 624 may be connected to the rack component case 104 at a different location, for example, on a top side or on the bottom side of the rack component case 104. The distal portion 630 is moveable with respect to the connection location at the proximal portion 628. For example, FIGS. 9 and 10 illustrate section views of the system 600, with the flexible member 624 respectively in a locked position and an unlocked position, according to various examples.

The distal portion 630 includes a latch member 638 protruding in a first direction opposite a first planar side of the flexible member 624. For example, when the latching component 606 is installed in the rack component case 104, the latch member 638 protrudes towards the side wall 634. As illustrated in FIG. 9, in the locked position, the latch member 638 extends through a pair of latch member openings, i.e., a latch member opening 140 in the side wall 134 of the rack component case 104 and a latch member opening 120 in the support bracket 110. As illustrated in FIG. 10, in the unlocked position, the latch member 638 is removed from at least the latch member opening 120 and, in some examples, is also removed from the latch member opening 140.

In the locked position, the latch member 638 interferes with surfaces in the latch member opening 120 to keep the rack component case 104 from being removed. This essentially locks the rack component case 104 into the server rack 102.

Figure 8:
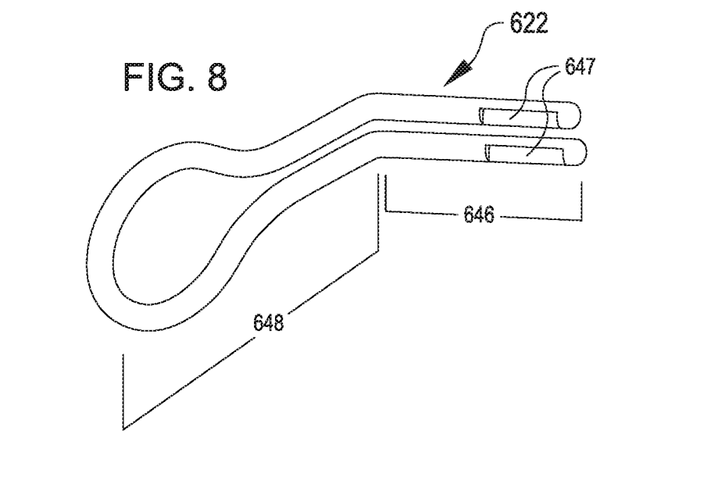
FIG. 8 illustrates a perspective view of a key component, according to at least one example.

Returning to the flexible member 624, the middle portion 632 includes a receiver structure 642. In some examples, the receiver structure 642 can be disposed in the distal portion 646. The receiver structure 642 is sized and configured to receive the key component 622. In particular, the receiver structure 642 can include one or more closed channels 649 sized to receive portions of the key component 622. For example, as FIG. 8 illustrates, the key component 622 includes a distal portion 646 and a proximal portion 648. The distal portion 646 is sized to fit within the closed channels 649. The distal portion 646 also includes one or more lance features 647. The lance features 647 are configured to engage with distal edges of the channels 649, as illustrated in FIGS. 9 and 10, to securely retain the distal portion 646 in the receiver structure 642. The distal portion 646 is also sized to fit through a key opening 608 in the front wall 136.

In some examples, the key component 622 is formed from a single piece of material such as round metal or plastic. In this example, the key component 622 includes a pair of legs in the distal region each comprising one of the lance features 647, and a handle in the proximal portion 648 formed from curved piece of material.

The proximal portion 648 of the key component 622 may be bent inward with respect to the distal portion 646. The proximal portion 648 may function as a handle for grasping the key component 622 to unlock the latching component 606 and to pull on to remove the rack component case 104 from the server rack 102. The inward bent design of the proximal portion 648 ensures that a user's hands will not be pinched as the rack component case 104 is removed from the server rack 102.

A process for using the key component 622 to unlock the latching component 606 will now be described. In FIG. 9, the latching component 606 is illustrated in the locked position, with the latch member 638 being within the openings 120 and 140. The latching component 606 and the key component 622 are aligned with a first axis 660 when in the locked position. Also in FIG. 9, a distal tip of the distal portion 646 of the key component 622 has been inserted through the key opening 608 in the direction of arrow 654. For example, a human user may grasp the key component 622 by the proximal portion 648, align the key component 622 with the key opening 608, and insert the distal tip into the key opening 608. As the user applies an installation force in the direction of the arrow 654, the key component 622 will slide toward the receiver structure 642. As this sliding continues, the lance feature(s) 647 will engage with the distal edges of the channels 649 of the receiver structure 642.

Following this first action of installing the distal portion 646 into the receiver structure 642, a second action may be performed using the key component 622. In particular, a removal force may be applied in the direction of arrow 655 opposite the arrow 654 (e.g., a pulling force exerted at the proximal portion 648). This opposite force creates a rotational moment 653 that causes the key component 622 and the flexible member 624 to begin to deflect about a fulcrum 651 (e.g., the connection location of the proximal portion 628 to the rack component case 104). This continues until the latching component 606 has been moved to the unlocked position illustrated in FIG. 10. To remove the key component 622, the key component 622 is returned to the initial position aligned with the axis 660 and the lance feature 647 disengages from the distal edges of the channels 649.

In the unlocked position, the distal portion 630 of the latching component 606 is aligned with a second axis 662 that is rotated about the fulcrum 651 with respect to the first axis 660. Because the action of the key component 622 to unlock the latching component 606 is rotational, in the unlocked position, the latching component 606 is aligned with the second axis 662. So long as the opposite force is exerted on the key component 622, the latching component 606 will remain in the unlocked position. When the opposite force is removed (e.g., after the user stops pulling on the key component 22) and/or the key component 622 is removed from the receiver structure 642, the latching component 606 returns to its biased position, the locked position.

In some examples, the latching component 606 may include a retention mechanism for retaining the latching component 606 in the unlocked position, even after the key component 622 has been removed from the latching component 606. This may be desirable to ensure that the latching members 638 are retracted within the rack component case 104 during installation and removal of the rack component case 104. Once the rack component case 104 has been installed, a triggering mechanism of the retention mechanism may triggered to cause the retention mechanism to release the latching component 606. For example, the triggering mechanism may include a tab that extends through an opening in the bottom of the rack component case 104 or in the side wall 134. The tab can be connected to a spring-loaded mechanism of the retention mechanism that holds the latching component 606 in the unlocked position. Contact between the tab and the support bracket 110 may compress the spring-loaded mechanism and thereby release the latching component 606 back to its biased position, the locked position.

The proximal portion 648 of the key component 622, which can function as a handle, can also include an identifying device such as the identifying device 152. Similar approaches of using the identifying device 152 may be applied to the key component 622.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
a rack-mountable server comprising a chassis, the chassis comprising:
  a floor;
  a side wall extending up from the floor;
  a front wall extending up from the floor; and
  a first latch member opening at the side wall of the chassis; and
a latching component configured to retain the rack-mountable server in a server rack having a second latch member opening, the latching component comprising:
  a flexible member connected to the side wall of the chassis at a proximal portion of the flexible member;
  a protrusion connected to the flexible member at a distal portion of the flexible member, the flexible member:
    biased into a locked position in which the protrusion extends into the first and second latch member openings; and
    deflectable into an unlocked position in which the protrusion is removed from the second latch member opening; and
  a receiver structure disposed between the distal portion and the proximal portion; and
  a key component sized to be received into the receiver structure and configured to move the latching component from the locked position to the unlocked position.

2. The system of claim 1, wherein the key component moves the flexible member from the locked position to the unlocked position in response to the key component moving from a first position to a second position with respect to the flexible member.

3. The system of claim 2, wherein:
in the first position, a distal tip of the key component is outside the receiver structure; and
in the second position, the distal tip of the key component is within the receiver structure.

4. The system of claim 2, wherein a proximal portion of the key component rotates in a direction away from the front wall as the key component moves from the first position to the second position.

5. The system of claim 1, further comprising a reader system configured to:
receive information about the key component; and
determine that the key component has been used to interact with the latching component based on the information.

6. The system of claim 1, further comprising an active device configured to detect a position of the rack-mountable server with respect to the server rack based on the key component interacting with the latching component.

7. A system, comprising:
a rack component case comprising an interior surface, the rack component case configured to support a rack component; and
a latching component connected to the rack component case at the interior surface, the latching component comprising a receiver structure sized and configured to receive an unlatching component that, when received by the receiver structure, moves the latching component from a locked position in which a protrusion of the latching component extends outside the rack component case and an unlocked position in which the protrusion is removed from outside the rack component case, wherein the unlatching component is separate and removable from the latching component.

8. The system of claim 7, wherein the rack component case further comprises a side wall having a protrusion opening formed therein, the latching component connected to the rack component case at the side wall, and the protrusion moveable between the locked position and the unlocked position via the protrusion opening.

9. The system of claim 7, further comprising the unlatching component, the unlatching component being configured to move the latching component from the locked position to the unlocked position in response to the unlatching component moving from a first position to a second position with respect to the latching component, the unlatching component separate from the latching component.

10. The system of claim 7, further comprising the unlatching component, the receiver structure disposed in a distal portion of the latching component, the receiver structure sized and configured to receive a distal portion of the unlatching component.

11. The system of claim 7, further comprising the unlatching component, the receiver structure disposed in a middle portion of the latching component, and the receiver structure sized and configured to receive a distal portion of the unlatching component.

12. The system of claim 11, wherein:
the receiver structure comprises a triangular structure;
the unlatching component comprises an inclined plane beginning at the distal portion and growing in height towards a proximal portion of the unlatching component; and
movement of the unlatching component from a first position to a second position with respect to the latching component causes the inclined plane to physically contact the triangular structure and move the latching component from the locked position to the unlocked position.

13. The system of claim 11, wherein:
the receiver structure comprises a closed channel;
the unlatching component comprises an elongate member having a lance feature disposed at the distal portion; and
when the distal portion is received within the closed channel, rotation of a proximal portion of the unlatching component from a first position to a second position with respect to the latching component causes the lance feature to engage with a distal edge of the closed channel and move the latching component from the locked position to the unlocked position.

14. The system of claim 9, wherein:
the latching component is aligned with a first axis when the latching component is in the locked position;
a distal portion of the latching component is aligned with a second axis when the latching component is in the unlocked position; and
the unlatching component is aligned with the first axis when the latching component is in the locked position and when the latching component is in the unlocked position.

15. The system of claim 9, wherein:
the latching component is aligned with a first axis when the latching component is in the locked position;
the latching component is aligned with a second axis when the latching component is in the unlocked position; and
the unlatching component is aligned with the second axis when the latching component is in the unlocked position.

16. The system of claim 7, wherein the rack component case further comprises a handle.

17. A device, comprising:
a proximal portion for connection to an interior surface of a case of a rack component;
a distal portion opposite the proximal portion, the distal portion comprising a latch member moveable between:
  a locked position in which the latch member is outside the case when the proximal portion is connected to the interior surface; and
  an unlocked position in which the latch member is removed from outside the rack component when the proximal portion is connected to the interior surface; and
a receiver structure mounted between the distal portion and the proximal portion, the receiver structure configured to receive a key component,
  wherein the key component is separate and removable from the device and configured to cause the latch member to move from the locked position to the unlocked position.

18. The device of claim 17, wherein the latch member extends away from a first side surface of the device and the receiver structure extends away from a second side surface of the device.

19. The device of claim 18, wherein the receiver structure comprises an inclined plane.

20. The device of claim 17, wherein the key component is received by the receiver structure in response to an installation force exerted in a first direction and causes the latch member to move from the locked position to the unlocked position in response to a removal force exerted in a second direction.

\* \* \* \* \*